United States Patent [19]

Asano et al.

[11] Patent Number: 5,929,513
[45] Date of Patent: Jul. 27, 1999

[54] SEMICONDUCTOR DEVICE AND HEAT SINK USED THEREIN

[75] Inventors: Yuichi Asano; Akihiro Kubota; Koichi Sibasaki; Kazuhiro Yonetake, all of Murata-machi; Tsuyoshi Aoki, Kawasaki, all of Japan

[73] Assignee: Fujitsu Limited, Kanagawa, Japan

[21] Appl. No.: 08/886,013

[22] Filed: Jun. 30, 1997

Related U.S. Application Data

[63] Continuation of application No. 08/490,006, Jun. 13, 1995, abandoned.

[30] Foreign Application Priority Data

| Aug. 16, 1994 | [JP] | Japan | 6-192538 |
| Dec. 7, 1994 | [JP] | Japan | 6-303958 |

[51] Int. Cl.[6] ............ H01L 23/28; H01L 23/10; H01L 23/495
[52] U.S. Cl. ............ 257/675; 257/707; 257/796
[58] Field of Search .................. 257/675, 775, 257/796, 666, 676, 707, 670

[56] References Cited

U.S. PATENT DOCUMENTS

| 4,204,317 | 5/1980 | Winn | 257/670 |
| 5,227,662 | 7/1993 | Ottno et al. | 257/675 |

FOREIGN PATENT DOCUMENTS

| 61-224441 | 10/1986 | Japan | 257/676 |
| 1293553 | 11/1989 | Japan | 257/675 |
| 2122660 | 5/1990 | Japan | 257/670 |
| 4120765 | 4/1992 | Japan | 257/775 |
| 4127564 | 4/1992 | Japan | 257/666.2 |
| 6120402 | 4/1994 | Japan | 257/670 |
| 6132441 | 5/1994 | Japan | 257/675 |
| 6196614 | 7/1994 | Japan | 257/675 |

*Primary Examiner*—Teresa M. Arroyo
*Attorney, Agent, or Firm*—Armstrong, Westerman, Hattori, McLeland & Naughton

[57] ABSTRACT

The present invention relates to a semiconductor device in which inner leads of a lead frame are electrically connected to a semiconductor chip, a method for producing thereof and a lead frame used therein. The object of the present invention is to improve a strength of the lead frame and a heat release efficiency in a small-size multi-pin type semiconductor device. In the inner lead of the lead frame, a thin plate portion is formed. The thin plate portions are secured on a heat spreader. A semiconductor chip is mounted on the heat spreader. The semiconductor chip is bonded to the thin plate portions of the inner leads through wires.

22 Claims, 10 Drawing Sheets

FIG. 3A
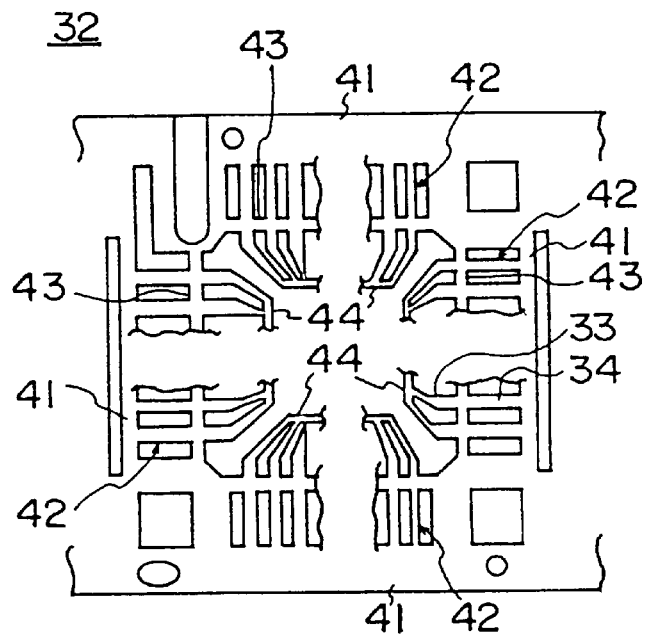
FIG. 3B
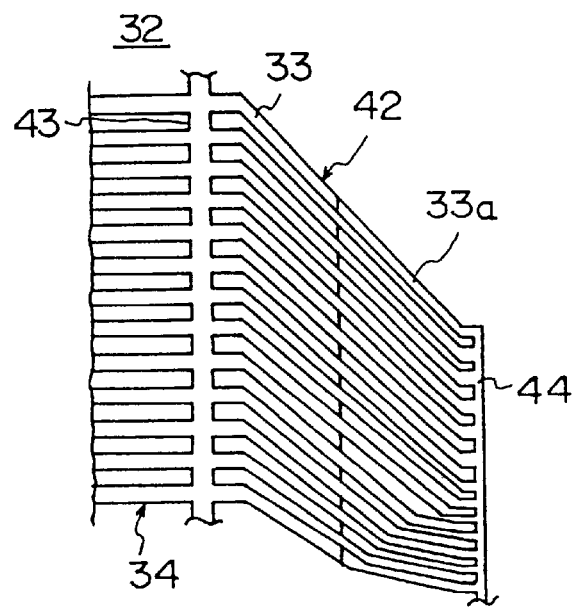
FIG. 3C

_5,929,513_

SEMICONDUCTOR DEVICE AND HEAT SINK USED THEREIN

This application is a File Wrapper Continuation of application Ser. No. 08/490,006 filed Jun. 13, 1995, now abandoned.

BACKGROUND OF THE INVENTION

1. Field of the Invention

The present invention generally relates to a semiconductor device, a method for producing thereof and a lead frame used therein, and more particularly to a semiconductor device in which a strength of a lead frame and a heat release efficiency can be improved, a method for producing thereof and a lead frame used therein.

2. Description of the Prior Art

Currently, in order to respond to a demand for a high-performance semiconductor device, a number of pins provided in a QFP (Quad Flat Package) type semiconductor has been increased. With this trend, an inner lead in a lead frame used in the semiconductor device becomes thinner and the strength thereof is lowered. Also, a heat amount generated by a semiconductor chip is increased. Therefore, the strength of the lead frame and the heat release efficiency of the semiconductor chip are required to be improved.

FIGS. 1A, 1B and 1C are sectional views showing conventional multi-pin type semiconductor devices.

In general, as a semiconductor device including a semiconductor chip is required to be decreased in size to meet the demand for the high-performance semiconductor device, the number of pins is increased and a pitch of pads formed in the semiconductor chip is decreased. Accordingly, ends of inner leads to be bonded to the pads via wires become fine, and a small-size pitch is required thereof.

However, when a lead frame of, for example, 0.15 mm in thickness is produced, an etching for making the ends of the inner leads with a small pitch is limited in accuracy, and the ends of the inner leads cannot be positioned close to a position at which the semiconductor chip is mounted.

In a semiconductor device 11 shown in FIG. 1A, after a thickness of an end portion 13a of an inner lead 13 of a lead frame 12 is made a half of the original by a half-etching process, the end portion is patterned to the small-size pitch by an etching process.

The semiconductor device 11 is disclosed in Japanese Laid-Open Patent Application No. 59-98547. In the semiconductor device 11, a film 15 is attached to the above-mentioned inner lead (end portion 13a). Between the inner leads 13 facing each other on the film 15, a semiconductor chip 16 is mounted through an adhesive 17. After the end portions 13a of the inner leads 13 are bonded to pads provided in the semiconductor chip 16 through wires 18, a package 19 is formed by a resin molding. Outer leads 14 extending from the package 19 are formed in a gull-wing shape for a surface connection.

On the other hand, a semiconductor device 21 shown in FIG. 1B is disclosed in Japanese Laid-Open Patent Application No. 4-6863. In this semiconductor device 21, an end portion 23a of an inner lead 23 in a lead frame 22 is apart from a semiconductor chip 25 in order that a plurality of pins can be provided in the semiconductor device 21. In this case, a heat spreader 26 on which the end portions 23a of the inner leads 23 are secured is used in order to improve a heat release efficiency. On the heat spreader 26, the semiconductor chip 25 is mounted through an adhesive 27. Pads provided on the semiconductor chip 25 are connected to the end portions 23a of the inner leads 23 through wires 28. A package 29 is formed by a resin molding and outer leads 24 extending from the package 29 are formed in the gull-wing shape.

In a semiconductor device 21A shown in FIG. 1C, on the heat spreader 26 shown in FIG. 1B, patterns 26a connected to corresponding inner leads 23 are formed. The pads in the semiconductor chip 25 are bonded to the patterns 26a through wires 28a. These wires 28a can be shorter than the wires 28 and a cost for wires can be reduced accordingly.

However, in the semiconductor device 11 shown in FIG. 1A, though the thin end portions 13a of the inner leads 13 are reinforced by the film 15, the end portions 13a are not strong enough. That is, the end portions 13a may be changed in shape when the molding resin is molded at a high pressure, and a reliability of the semiconductor device 11 may be lowered.

Also, in the semiconductor device 21 shown in FIG. 1B, though a multi-pin type semiconductor device is available without making the inner leads 23 thinner, the end portions 23a cannot be positioned close to the semiconductor chip 25 and the wires 28 become longer. It increases the cost for wires and prevents a high-speed operation of the semiconductor device.

Further, in the semiconductor device 21A shown in FIG. 1C, though the wires 28a are shorter, the cost is increased by forming the patterns 26a on the heat spreader 26.

SUMMARY OF THE INVENTION

Accordingly, it is a general object of the present invention to provide a novel, useful semiconductor device in which a strength of a lead frame and a heat release efficiency can be improved, a method for producing thereof and a lead frame used therein.

The above object of the present invention is achieved by a semiconductor device comprising a semiconductor chip, a lead frame in which a plurality of lead terminals are provided, each of the lead terminals having an inner lead at one end and an outer lead at the other end, the inner lead of each of the lead terminals having a thin plate portion at a prescribed portion which is thinner than the other portion thereof, a heat spreader mounting the semiconductor chip thereon and releasing heat generated by the semiconductor chip, on which the heat spreader the lead frame is secured and the thin plate of the inner lead is positioned close to the semiconductor chip, and a sealing portion sealing the semiconductor chip and the heat spreader connected to the thin plate portion of the inner lead, the outer lead of each of the lead terminals protruding from the sealing portion. In the above invention, the heat spreader can be made of a material having a higher thermal conductivity than the sealing portion.

According to the above invention, since the inner lead is secured on the heat spreader for improving a heat release efficiency, a strength of the lead frame can be improved though the thin plate portion is formed in the inner lead. Also, a quantity production thereof can be performed.

In the above invention, an end portion of the inner lead including the thin plate portion can be secured on the heat spreader through an adhesive.

According to the invention, an error due to a heat shrinkage occurring when the sealing portion is formed is reduced and a reliability of the device can be improved.

In above invention, an opposite surface of the heat spreader to a surface on which the semiconductor chip is mounted can be exposed at least from the sealing portion. Also, in the above invention, an opening portion for exposing the opposite surface of the heat spreader to the surface on which the semiconductor chip is mounted can be formed in the sealing portion, the semiconductor device further comprises a heat release member contacting the heat spreader and exposed in the opening portion.

According to the above inventions, a heat release efficiency of heat at a risen temperature as the semiconductor chip is decreased in size can be improved.

In the above invention, the heat release member can have a plurality of penetration holes formed therein, the penetration holes passing from the heat spreader to the exposed surface of the heat release member. Also, in the above invention, the plurality of penetration holes can be formed in the periphery of the exposed surface of the heat release member. According to the invention, water generated when the sealing portion is formed can be drained through the penetration holes. Therefore, a defect in the sealing portion can be prevented and a reliability of the semiconductor device can be improved.

The above object of the present invention is achieved by a lead frame to be connected to a semiconductor chip in a package comprising a plurality of lead terminals, each of the lead terminals having an inner lead to be placed in the package and an outer lead to be extended from the package, the inner lead being positioned close to the semiconductor chip, the inner lead of each of the lead terminals having a thin plate portion which is thinner than other portion thereof, and a connecting portion to which each of the thin plate portion is connected. In the above invention, the thin plate portion can be formed by an etching process.

According to the invention, the thin plate portion is formed by the etching process of the inner lead of the lead frame, and each thin plate portion is connected through the connecting portion. Therefore, an accuracy in positioning of the inner lead can be improved. Also, a strength of the thin plate portion can be improved.

Also, in the above invention, the lead terminal can comprises a plurality of metal plates laminated together, the thin plate portion being formed by an etching process. Also, in the above invention, the lead terminal can comprise a plurality of metal plates laminated together so as to form the thin plate portion. Further, according to the invention, the lead terminal can comprise a plurality of metal plate members laminated together, wherein the thin plate member is formed by the etching process or by stacking the metal plate members. Accordingly, the thin plate portion can be made easily even if the lead frame is multi-layered.

Further, in above invention, the lead terminal except the thin plate portion can have a thickness depending on a thermal resistance thereof and a strength of the outer lead. According to the invention, as the thermal resistance is improved, a heat release efficiency can be improved. Also, since a change in shape of the outer lead is prevented, a connecting process can be conducted easily.

The above object of the present invention is achieved by a method for producing a semiconductor device comprising the steps of preparing a lead frame, the lead frame comprising a plurality of lead terminals, the lead terminal having an inner lead to be placed in a package and an outer lead to extend from the package, the inner lead to be positioned close to a semiconductor chip, the inner lead having a thin plate portion which is thinner than other portion of the lead terminal, and a connecting portion through which each end of the thin plate portion is connected, securing the connecting portion on a heat spreader, cutting and removing the connecting portion, mounting the semiconductor chip between the connecting portions on the heat release member, connecting electrically the semiconductor chip to the thin plate portion, and forming a sealing portion by sealing the semiconductor chip and the heat spreader, the outer lead extending from the sealing portion.

According to the invention, the connecting portion of the thin plate portion of the inner lead is secured on the heat spreader. The semiconductor chip is electrically connected to the thin plate portion after the connecting portion is removed. Subsequently, the sealing portion is formed. Accordingly, a heat release efficiency can be improved by the heat release member and a mechanical strength can be improved by the connecting portion of the inner lead.

In the above invention, an opposing surface of the heat spreader to a surface on which the semiconductor device is mounted can be exposed from the sealing portion.

Also, the above invention can further include the step of, forming an opening portion through which the opposing surface to the surface on which the semiconductor device is mounted is exposed, providing a heat release member connecting to the heat spreader in the opening portion, the heat spreader being exposed in the opening portion.

Other objects and further features of the present invention will be apparent from the following detailed description when read in conjunction with the accompanying drawings.

BRIEF DESCRIPTION OF THE DRAWINGS

FIG. 3A is a plan view showing an lead frames provided in series for one semiconductor device;

FIG. 3B is a fragmentary plan view showing an inner lead;

FIG. 3C is a sectional view showing an inner lead;

DESCRIPTION OF THE PREFERRED EMBODIMENTS

Figure 1A:
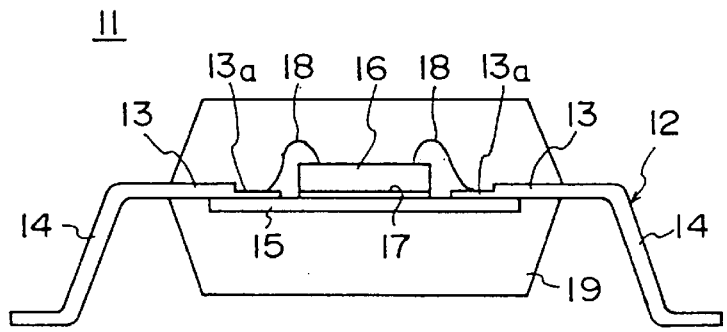
FIGS. 1A, 1B and 1C are sectional views showing conventional semiconductor devices of a multi-pin type.
Figure 1B:
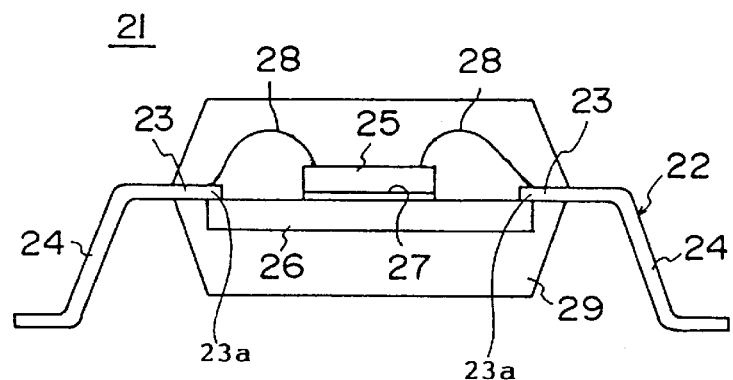
Figure 1C:
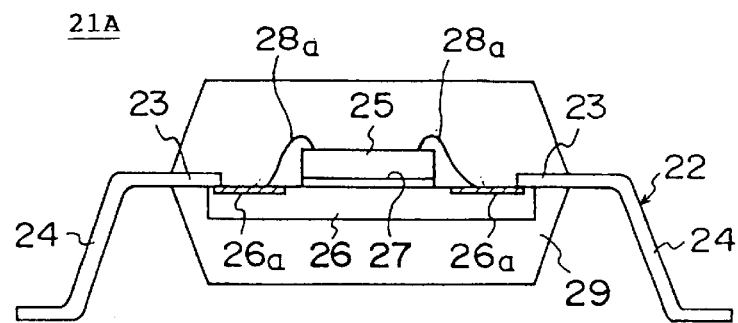

Referring to the drawings, the preferred embodiments of the present invention will now be described in further detail.

Figure 2A:
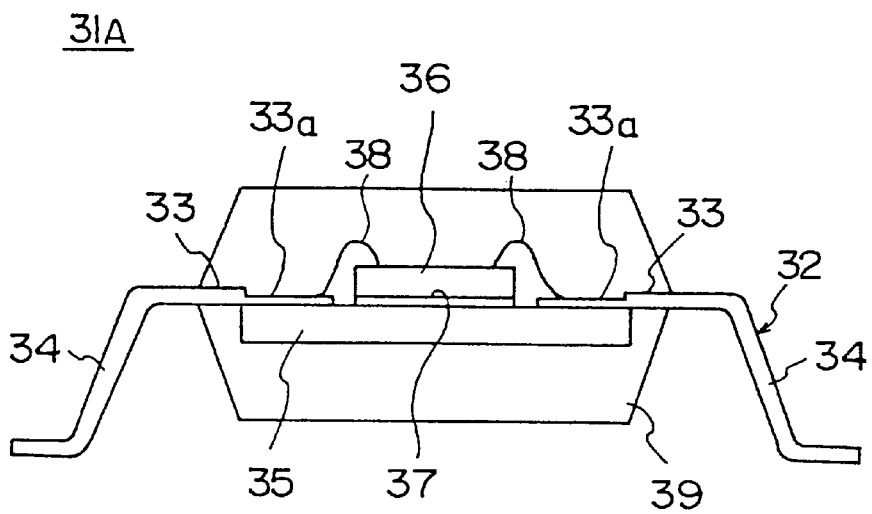
FIG. 2A is a vertical sectional view showing a first embodiment of the present invention.
Figure 2B:
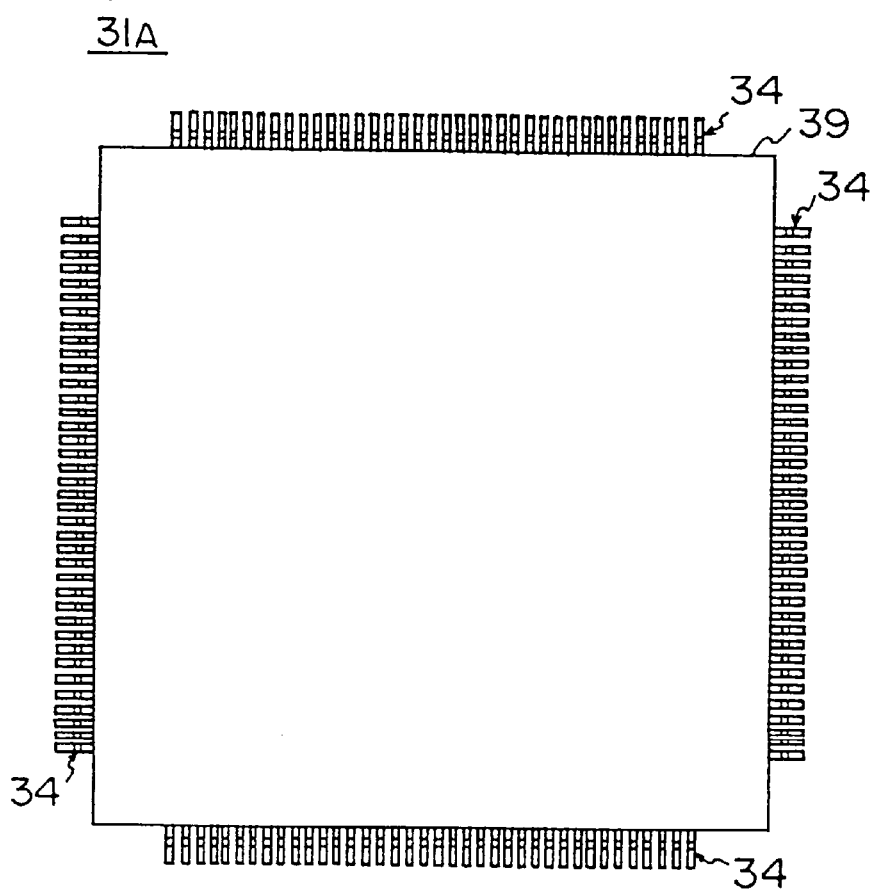
FIG. 2B is a plan view showing the first embodiment of the present invention.

FIG. 2A is a vertical sectional view showing a first embodiment of the present invention and FIG. 2B is a plan view thereof.

A semiconductor device 31A shown in FIGS. 2A and 2B is a QFP-type semiconductor device having a lead frame 32. The lead frame 32 has a plurality of inner leads 33 and outer leads 34. An inner end-of the inner lead 33 is a thin plate portion 33a, which is thinner than other portions of the lead frame 32 (described in detail in FIGS. 3A, 3B and 3C). The thin plate portion 33a of the inner lead 33 is secured on a heat spreader 35 (described in detail in FIG. 4), which functions as a heat release member, through an adhesive. On the central portion of the heat spreader surrounded by the inner leads 33 (thin plate portions 33a), a small-size semiconductor chip 36 is mounted through an adhesive 37, for example, a silver paste. In this case, the thin plate portions 33a of the inner leads 31 are arranged close around the semiconductor chip 36.

The thin plate portions 33a of the inner leads 33 are bonded and electrically connected to electrode pads (not shown in the drawings) formed on the semiconductor chip 36 through wires 38 made of, for example, gold. A package 39 or a sealing portion is formed by a sealing resin in which the heat spreader 35 is buried. The outer leads 34 of the lead frame 32 extending from four sides of the package 39 and are formed in a gull-wing shape for surface connections.

FIG. 3A is a plan view showing the lead frame provided in series for one semiconductor device. FIG. 3B is a fragmentary plan view of the inner leads. FIG. 3C is a sectional view showing an inner lead.

In the lead frame 32 shown in FIG. 3A, lead terminals 42 are provided between cradles and are connected to each other through a tiebar 43. A central side of the tieber 43 is the inner leads 33 and the outer side of the tieber 43 is the outer leads 34. A central end of each inner lead is connected to a connecting portion 44. In the space surrounded by the connecting portions 44, the semiconductor chip 36 is mounted. These are formed by, for example, an etching process on a 0.15 mm thick metal plate of, for example, copper alloy.

FIG. 3B is a fragmentary enlarged view of lead terminal 42. The tieber 43 and the connecting portion 44 are removed by cutting in a prescribed process. At the end of the inner lead 33, as shown in FIGS. 3A, 3B and 3C, a thin plate portion 33a of a prescribed length is formed. The thin plate portion 33a is formed to, for example, about 0.075 mm in thickness by a half-etching process, as shown in FIG. 3C.

In this type of lead frame 32, the thin plate portion 33a is formed at the end of the inner lead 33. Accordingly, even when the thin plate portion 33a is positioned close to the area in which the semiconductor chip 36 is provided, the inner lead 33 can be formed to microscopic pitch by an etching process.

Accordingly, since the wire 38 to make an electrical connection to the semiconductor chip 35 can be decreased in length in a multi-pin type semiconductor device, a cost for wire can be decreased. Also, a high-speed operation due to a reduction of impedance and a reliability of the device due to a reduction of wire flow can be improved. By the inner leads 33 being arranged close to the semiconductor chip 36, the present invention can cope with different size of the semiconductor chips 36. Therefore, the yield of the semiconductor device can be improved.

Since the connecting portion 44 is incorporated with the thin plate portions 33a of the inner leads 33 before the thin plate portions 33a are secured, a strength of the lead frame 32 can be improved and a change in shape thereof can be prevented when it is conveyed. Therefore, a yield of the semiconductor device 32 can be improved.

After the connecting portion 44 in the inner lead 33 is cut and removed, most of the thin plate portion 33a is secured on the heat spreader 35. Accordingly, the thin plate portion 33a is not changed in shape after the resin is molded. Therefore, the yield of the semiconductor device can be improved.

The semiconductor chip 36 is mounted on the central portion of the heat spreader 35. The connecting portions 44 of the inner lead frame 32 are arrange around the semiconductor chip 36, as described later.

The heat spreader 35 can be made of, for example, copper-tungsten (W—C) alloy. A thermal expansion coefficient of 20% W—Cu alloy is $5.1 \times 10^{-6}/°$ C. at 400° C. and $7.3–7.7 \times 10^{-6}/°$ C. at 800° C. A thermal conductivity thereof is 0.58 cal/cm·sec·° C. A thermal expansion coefficient of 30% W—Cu alloy is $10.6 \times 10^{-6}/°$ C. at 400° C. and $12.0 \times 10^{-6}/°$ C. at 800° C. A thermal conductivity thereof is 0.67 cal/cm·sec·° C. That is, the thermal conductivity of the W—Cu alloy used in the heat spreader 35 is in the same rank as one of a copper alloy (0.25–0.85 cal/cm·sec·° C.) and a heat release characteristic thereof is excellent.

Figure 4:
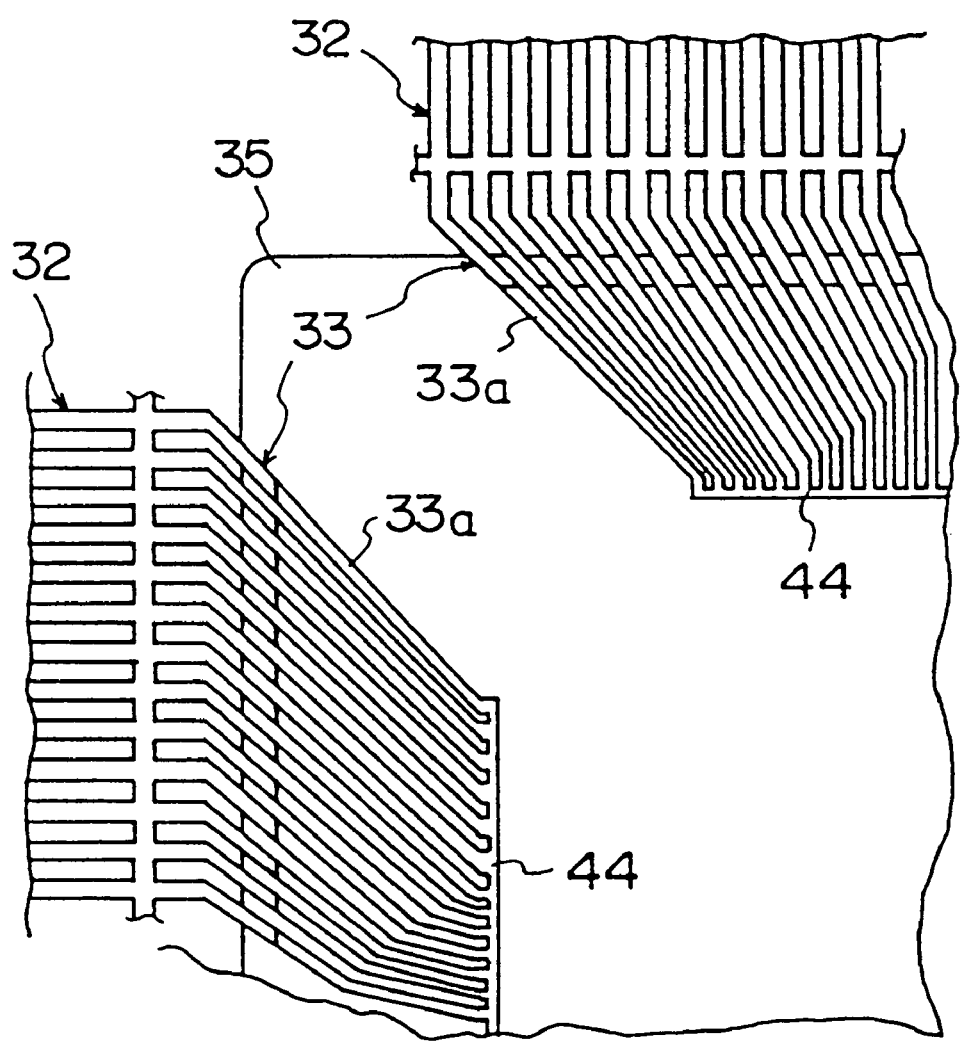
FIG. 4 is a fragmentary plan view showing inner leads mounted on a heat spreader.
Figure 5:
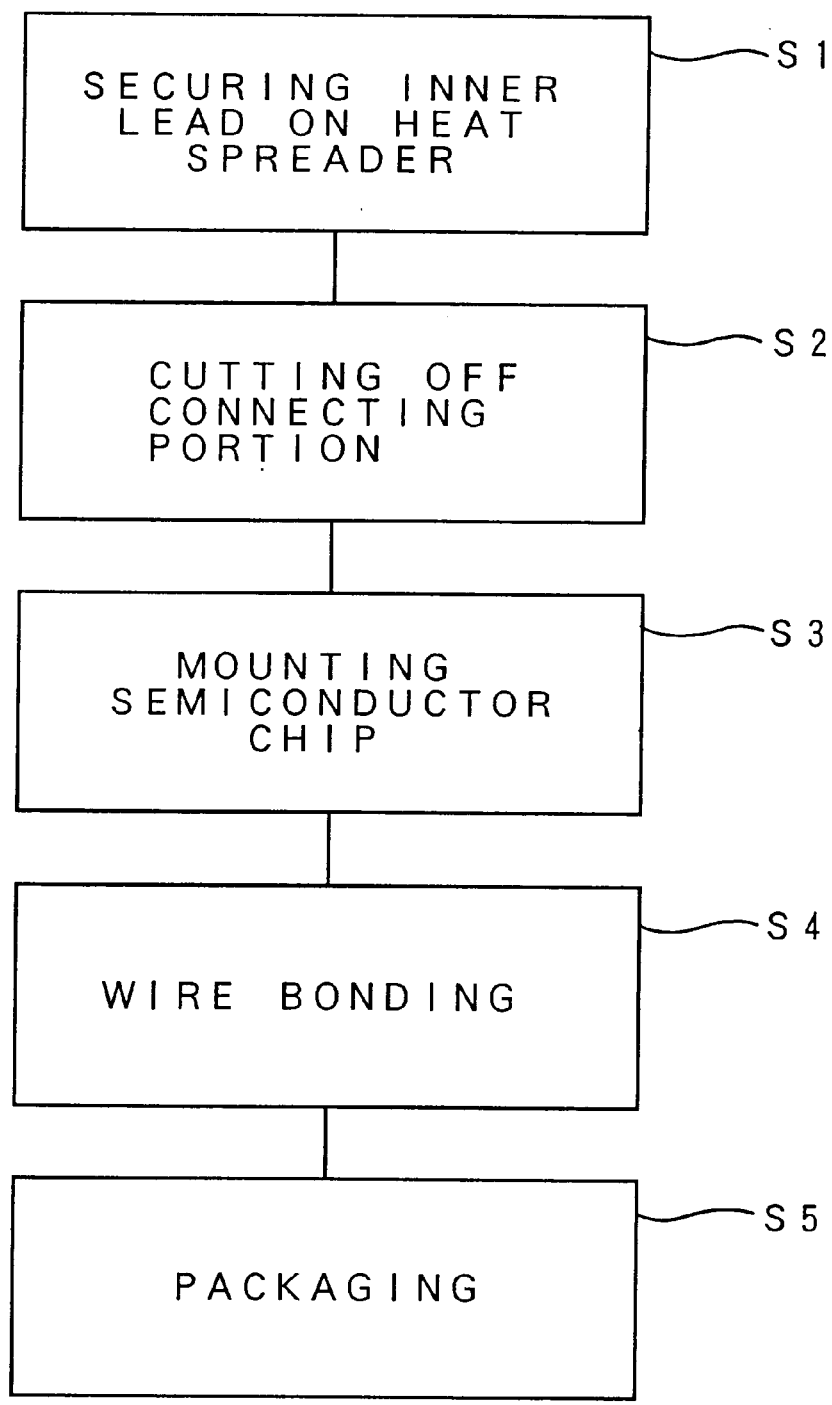
FIG. 5 is a flowchart describing a method for producing a semiconductor device of the present invention.

FIG. 4 is a fragmentary plan view of inner leads 33 mounted on the heat spreader 35. FIG. 5 is a flowchart for describing a method for producing the semiconductor device 31A.

Figure 6:
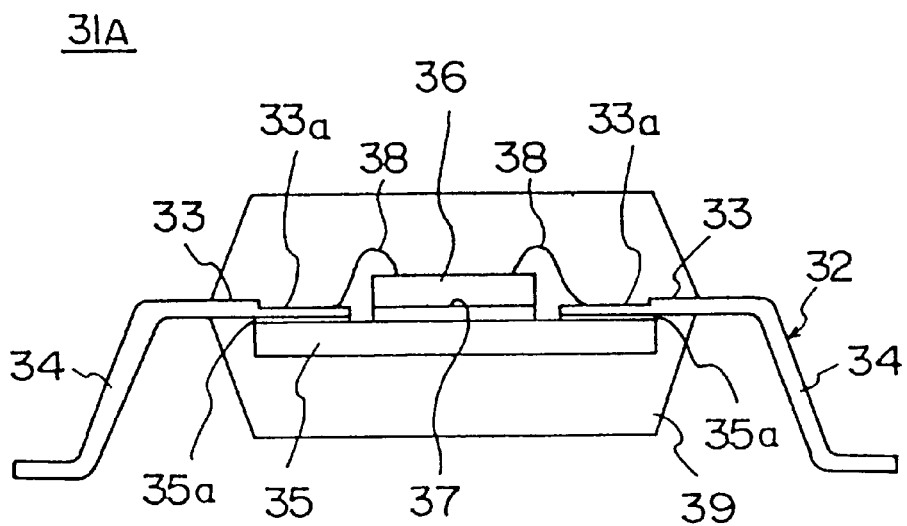
FIG. 6 is a vertical sectional view showing a variation of the first embodiment of the present invention.

Referring to FIG. 5, the inner leads 33 of the lead frame 32 are secured on the heat spreader 35 through an adhesive 35a shown in FIG. 6 (Step S1). At this moment, as shown in FIG. 5, the connecting portions 44 or the ends of the thin plate portions 33a are arranged around the heat spreader 35. By making a contact area between the inner lead 33 and heat spreader 35 a maximum, heat release characteristics and electric characteristics can be improved. Also, an adhesive quality can be improved to adjust an error caused by a thermal shrinkage after the package is formed.

On the heat spreader 35, the connecting portion 44 of the inner leads 33 are cut and removed by, for example, exposing a laser rays thereon (Step S2). Next, the semiconductor chip 36 is mounted on the central portion of the heat spreader 35 through the adhesive 37 (Step S3). After that, the electrode pads (not shown in the drawings) are bonded to the thin plate portions 33a (a portion on the heat spreader 35) of the inner leads 32 through the wires 38 (Step S4). After that, the semiconductor device is placed in a mold and molding resin (i.e epoxy resin) is molded to form the package 39 (Step S5).

In this manner, the inner ends of the thin plate portions 33a are incorporated with the connecting portion 44 before the inner leads 33 are secured on the heat spreader 35. Accordingly, the strength of the thin plate portion is improved and the change in shape of the leads can be prevented when it is conveyed. Also since the thin plate portion 33a is secured on the heat spreader 35 when the mold resin is molded, the change in shape of the lead frame 32 due to pressure can be prevented.

FIGS. 6–9 are vertical sectional views showing variations of the first embodiment. In a semiconductor device 31A shown in FIG. 6, a wider area of the inner end of the inner lead 33 including the thin plate portion 33a of the lead frame 32 is secured on the heat spreader 35 through an adhesive member 35a such as a PI (polyimide) tape and an epoxy adhesive in the semiconductor device 31A shown in FIGS. 2A and 2B. The other features thereof are the same as the ones shown in FIGS. 2A and 2B. That is, as the inner ends of the inner leads 33 are secured on the heat spreader 35 over a larger contacting area, an error due to heat shrinkage can be adjusted and the wire 38 is prevented from being cut when the package 39 is molded. Accordingly, the yield of the semiconductor device can be improved.

Figure 7:
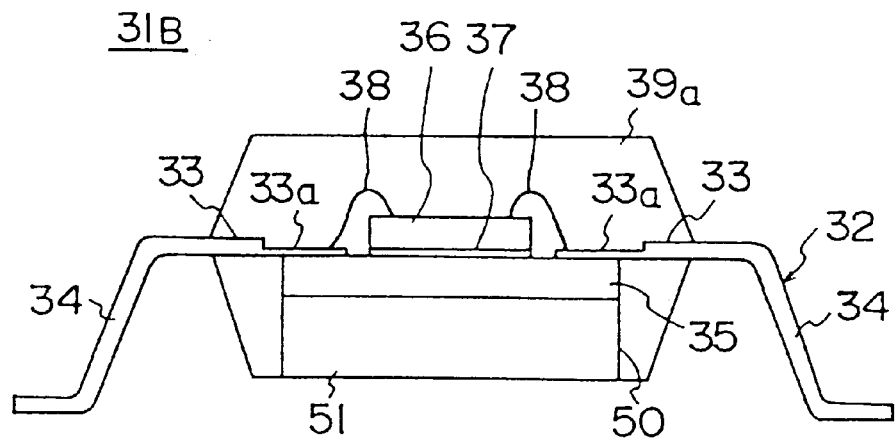
FIG. 7 is a vertical sectional view showing another variation of the first embodiment of the present invention.

In a semiconductor device 31B shown in FIG. 7, an opening portion 50 is formed at the bottom of the package 39 of the semiconductor device 31A shown in FIGS. 2A and 2B when a package 39a is formed. Through the opening portion 50, an opposite surface of the heat spreader 35 to the surface on which the semiconductor chip 36 is exposed. In the opening portion 50, a heat release plate 51 which contacts the heat spreader 35 is buried. At least one surface of the heat release plate 51 is exposed.

In order to form the opening portion 50, a protruding portion for forming the opening portion 50 is formed in a mold. The opening portion 50 can be formed by the protruding portion of the mold contacting the heat spreader 35 when the molding is conducted.

According to the semiconductor device 31B, a heat release efficiency of a heat at an increased temperature, resulting from the semiconductor chip 36 being decreased in size, can be much improved by the heat spreader 35 and heat release plate 51.

Figure 8A:
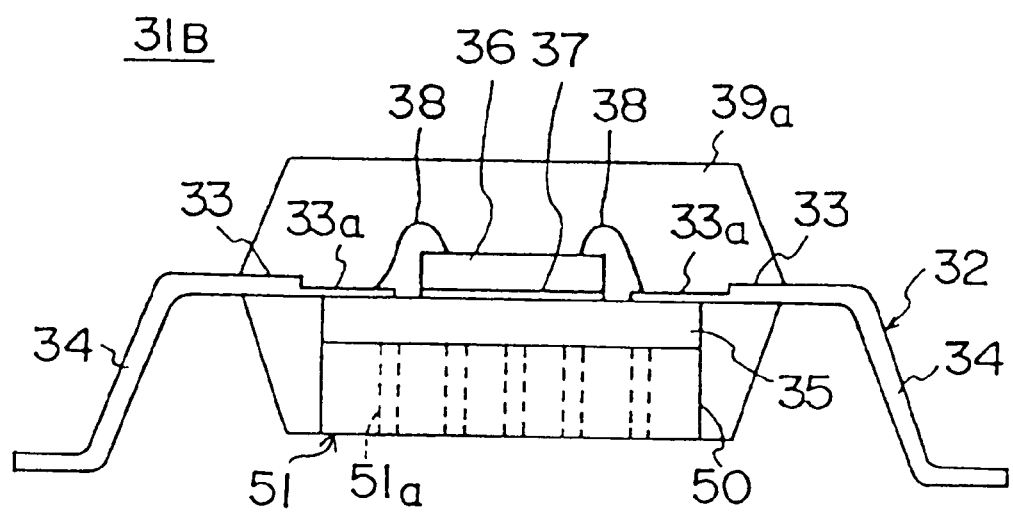
FIG. 8A is a vertical sectional view showing another variation of the first embodiment of the present invention.
Figure 8B:
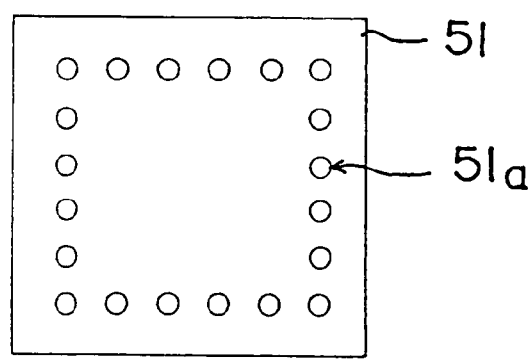
FIG. 8B is a bottom view showing a heat release board.

In the semiconductor device 31B shown in FIG. 8A, a prescribed number of penetration holes 51a are formed in the heat release board 51 from the heat spreader 35 side to the exposing surface. In this case, as shown in FIG. 8B, penetration holes 51a are formed to be arranged at the periphery of the exposing surface. That is, the penetration holes are formed in an area at a distance away from the semiconductor chip 36 mounting surface.

According to the semiconductor device 31B shown in FIGS. 8A and 8B, water included in the mold resin is drained from the boundary of the heat spreader 35 and heat release member 51 through the penetration holes 51a when the resin is hardened. In this case, drain holes are formed in a mold at a position corresponding to the penetration holes 51a of the heat release board.

Accordingly, cracking of the package 39a is prevented and the package efficiency is improved. That is, in order to prevent the cracking of the package 39a, a mold resin of a higher strength is not required. By providing penetration holes 51a in the heat release board 51, a mold resin of normal strength can be used and the increase in cost can be prevented.

Figure 9:
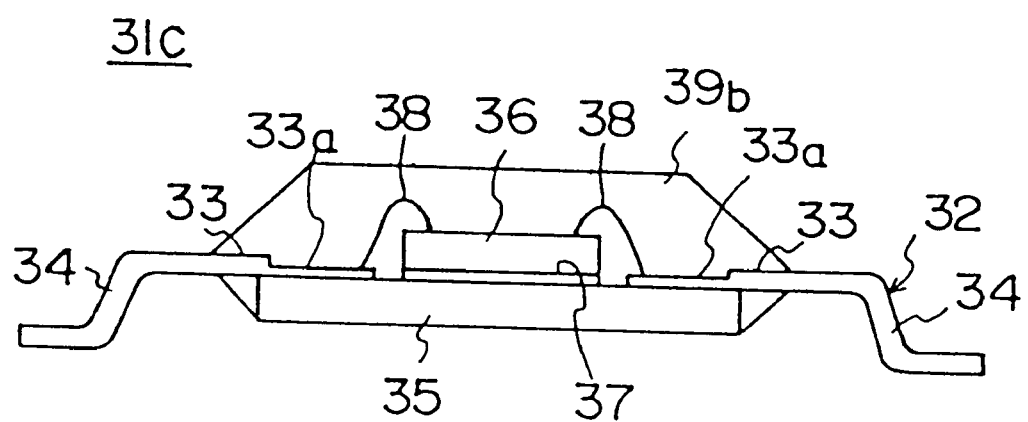
FIG. 9 is a vertical sectional view showing another variation of the first embodiment of the present invention.

In a semiconductor device 31C shown in FIG. 9, when a package 39b is formed, the opposite surface of the heat spreader to the surface on which the semiconductor chip 36 is mounted is exposed. This can be formed, for example, by the resin being molded after a bottom of a cavity of an under mold is attached to the heat spreader 35.

According to the semiconductor device 31C, since the bottom surface of the heat spreader 35 is exposed, a heat release efficiency can be improved and the device can be made thinner.

FIGS. 6–9 show different variations respectively, however these variations can be combined properly (i.e. FIG. 6 and FIG. 7, FIG. 6 and FIG. 8A, or FIG. 6 and FIG. 9). Needless to say, variations in the second embodiments described later can also be combined properly.

FIGS. 10A, 10B and FIGS. 11A, 11B, 11C show variations of the thin plate portion of the first embodiment of the present invention.

Figure 10A:
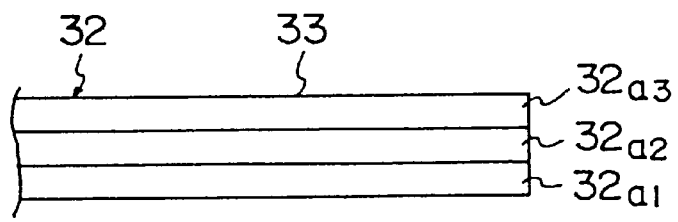
FIGS. 10A and 10B are schematic illustrations showing fabrication steps for a variation of the thin plate portion in the first embodiment of the present invention.
Figure 10B:
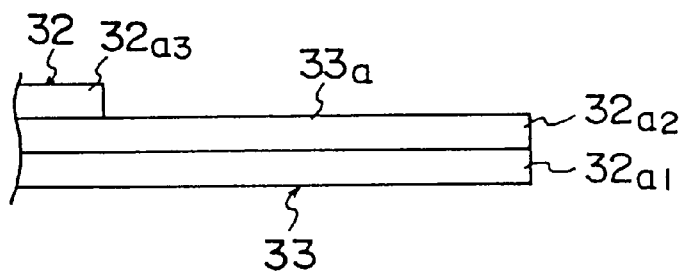

FIG. 10A shows an inner end of the inner lead in which thin metal members $32a_1$–$32a_3$ are laminated to form the lead frame 32 including the lead terminal 42 shown in FIGS. 3A, 3B and 3C. For example, the metal plate members $33a_1$, $33a_3$ can be made of iron material and the metal plate member $33a_2$ can be made of copper material. As shown in FIG. 10B, the inner end of the inner lead 33 can be half-etched selectively in order to form the thin plate portion 33a.

Figure 11A:
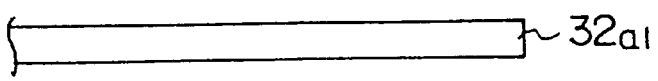
FIGS. 11A, 11B and 11C are schematic illustrations showing fabrication steps for another variation of the thin plate portion in the first embodiment of the present invention.
Figure 11B:
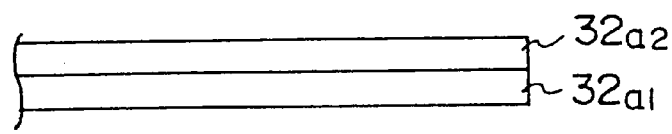
Figure 11C:
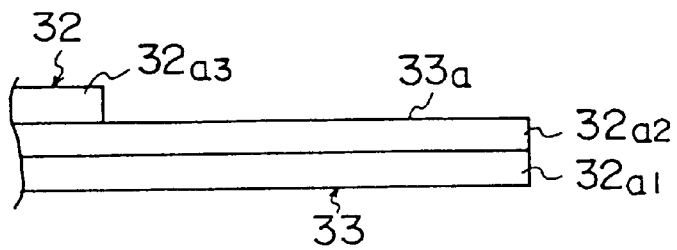

FIGS. 11A, 11B and 11C show a lead frame 32 including the lead terminal 42 shown in in FIGS. 3A, 3B and 3C in which thin metal plate members $32a_1$–$32a_3$ are laminated. At the inner end portion of the inner lead 32, the metal plate member $32a_2$ shown in FIG. 11B is laminated on the metal plate member $32a_1$ shown in FIG. 11A. On the metal plate member $32a_2$, the metal plate member $32a_3$ in which an end to be a thin plate portion 33a is cut off in advance is laminated as shown in FIG. 11C. According to the lead frame shown in FIG. 11C, the thin plate portion 33a can be made without an etching process compared to the lead frame shown in FIGS. 10A and 10B. In this case, the metal plate member $32a_1$–$32a_3$ can be made of iron material and copper material as described in FIGS. 10A and 10B, or all of them can be made of the same copper material. Therefore, if the lead frame 32 (lead terminal 42) is made of thin metal members $32a_1$–$32a_3$, the thin plate portion 33a can be made easily.

Figure 12A:
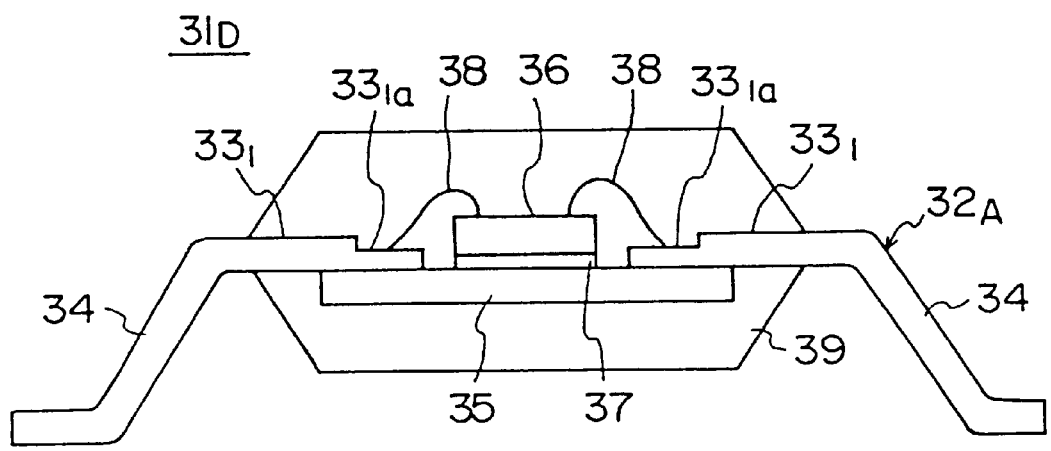
FIG. 12A is a vertical sectional view showing a semiconductor device of the second embodiment of the present invention.
Figure 12B:
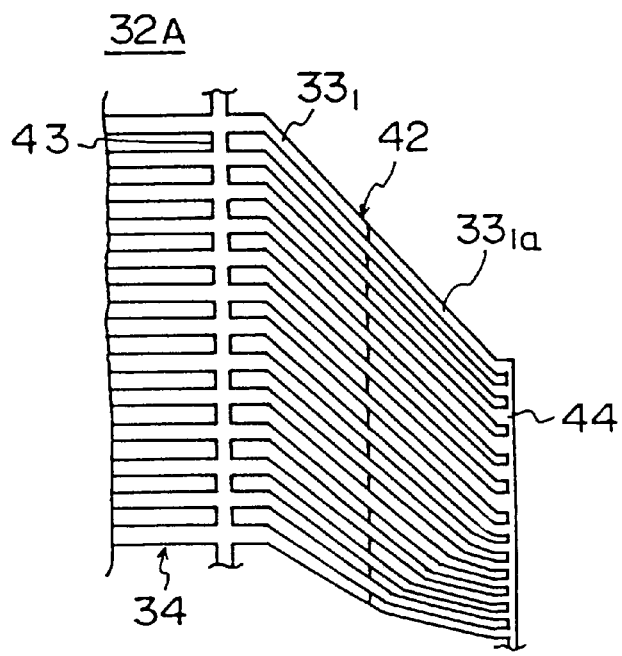
FIG. 12B is a fragmentary plan view showing an inner end portion of the inner lead of the second embodiment of the present invention.
Figure 12C:
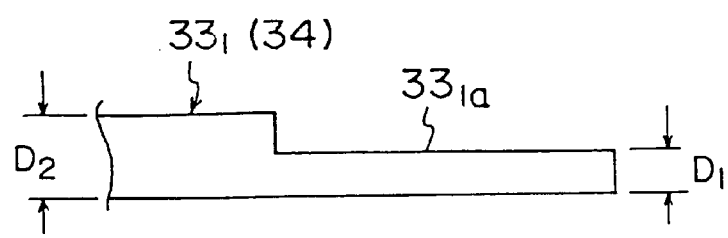
FIG. 12C is a sectional view showing the inner lead.

FIG. 12A is a vertical sectional view of a semiconductor device 31D of a second embodiment of the present invention. FIG. 12B is a fragmentary plan view showing a lead terminal (inner lead $33_1$, outer lead 34) in a lead frame 32A. FIG. 12C is a sectional view showing an inner end portion of the inner lead $33_1$ As shown in FIG. 12A, a semiconductor chip 36 is mounted on a heat spreader 35 through an adhesive. The inner leads $33_1$ of the lead frame 32A is secured around the semiconductor chip 36 through an adhesive. In the lead frame 32A, the inner ends of the inner leads $33_1$ are originally connected through a connecting portion 44. After the lead frame 32A is secured on the heat spreader 35, the connecting portion 44 is cut off and the inner leads $33_1$ are separated respectively. If the leads of the semiconductor device 31D are fine-pitched, a thin plate portion $33_1a$ is required to be thinner than the conventional lead frame, as shown in the first embodiment. If the thin plate portion $33_1a$ is not required to be thinner, the thickness $D_1$ of the thin plate portion $33_1a$ is set to the conventional thickness, 0.125–0.15 mm and the thickness $D_2$ of the other portion (a part of the inner lead $33_1$ and outer lead 34) is set to a greater thickness (i.e. 0.2–0.25 mm), as shown in FIGS. 12A, 12B and 12C.

That is, by setting the thickness $D_2$ of the outer lead 34 to the greater thickness, the thermal resistance is reduced and the heat release efficiency can be improved. Also, the mechanical strength of the outer lead 34 is increased and the change in shape of the outer lead 34 can be prevented when it is conveyed. Therefore, package efficiency and transportation characteristics can be improved.

Referring back to the FIG. 12A, the semiconductor chip 36 (electrode pad) is electrically connected to the thin plate portion $33_{1a}$ of the inner lead $33_1$ through the wire 38. Also, a package 39 is formed by epoxy resin 50. The outer lead 34 extending from the package 39 is formed in a gull-wing shape.

Further, the present invention is not limited to these embodiments, but various variations and modifications may be made without departing from the scope of the present invention.

What is claimed is:

1. A semiconductor device comprising:
   a semiconductor chip;
   a lead frame providing a plurality of lead terminals, each of said lead terminals having an inner lead at one end and an outer lead at the other end, said inner lead at said one end of each of said lead terminals having a thinner plate portion than a plate portion of said outer lead;
   a heat spreader formed of metallic material mounting said semiconductor chip thereon and being operative to release heat generated by said semiconductor chip,
   said thinner plate portions of said inner leads having their inner ends being disposed in closely spaced relation with respect to said semiconductor chip and being bonded to said heat spreader thereby securing said lead frame thereto,
   electrodes provided on said semiconductor chip being connected to said thinner plate portion of each said inner lead,
   a sealing portion covering said semiconductor chip, a portion of said heat spreader and the thinner plate portions of said inner leads attached to said heat spreader, and
   said outer lead portions of said lead terminals protruding to the exterior of said sealing portion.

2. A semiconductor device according to claim 1, wherein said thinner plate portion of said inner lead is secured to said heat spreader by adhesive bonding.

3. A semiconductor device according to claim 1, wherein a surface of said heat spreader opposite to a surface on which said semiconductor chip is mounted being devoid of said sealing portion to expose said heat spreader to the exterior of said device.

4. A semiconductor device according to claim 3, wherein an opening portion exposing said opposite surface of said heat spreader is formed in said sealing portion; and
   a heat release member being disposed in said opening portion and contacting said heat spreader.

5. A semiconductor device according to claim 4, wherein said heat release member has a plurality of penetration holes formed therein, said penetration holes extending from said heat spreader to the exposed surface of said heat release member.

6. A semiconductor device according to claim 5, wherein said penetration holes are formed about the periphery of said exposed surface of said heat release member in laterally displaced relation with respect to said semiconductor chip.

7. A lead frame to be connected to a semiconductor chip in a package comprising:
   a plurality of lead terminals, each of said lead terminals having an inner end for placement in closely spaced relation with respect to said semiconductor chip within said package and an outer end for extending from said package, said inner end of each of said lead terminals containing a thin plate portion having a thickness which is less than the thickness of the remainder of said lead terminal; and
   a connecting portion interconnecting the thin plate portions of said inner leads.

8. A lead frame according to claim 7, wherein said thin plate portion is formed by an etching process.

9. A lead frame according to claim 7, wherein said lead terminals each comprise a plurality of metal plates laminated together, said thin plate portion having a shape formed by an etching process.

10. A lead frame according to claim 7, wherein said lead terminal comprises a plurality of stacked metal plates laminated together to form said thin plate portion.

11. A lead frame according to claim 7, wherein said lead terminal, except said thin plate portion, has a thickness proportionate to a thermal resistance thereof and to a strength of said outer lead.

12. A semiconductor device comprising:
    a semiconductor chip;
    a lead frame providing a plurality of lead terminals, each of said lead terminals having an inner lead at one end and an outer lead at the other end, said inner lead at said one end of each of said lead terminals having a side containing a recess defining a thinner plate portion than the plate portion of said outer lead;
    a heat spreader formed of metallic material mounting said semiconductor chip thereon and being operative to release heat generated by said semiconductor chip;
    said thinner plate portions of said inner leads having their inner ends being disposed in closely spaced relation with respect to said semiconductor chip and having a side of said inner lead opposite said side containing said recess bonded to said heat spreader thereby securing said lead frame thereto;
    electrodes provided on said semiconductor chip being connected to said thinner plate portion of each said inner lead;
    a sealing portion covering said semiconductor chip, a portion of said heat spreader and the thinner plate portions of said inner leads attached to said heat spreader; and
    said outer lead portions of said lead terminals protruding to the exterior of said sealing portion.

13. A semiconductor device according to claim 12, wherein an end portion of said inner lead including said thinner plate portion is secured on said heat spreader through an adhesive.

14. A semiconductor device according to claim 12, wherein an opposite surface of said heat spreader to a surface on which said semiconductor chip is mounted is exposed to the exterior of said device at least from said sealing portion.

15. A semiconductor device according to claim 14, wherein an opening portion exposing an opposite surface of said heat spreader to a surface on which said semiconductor chip is mounted is formed in said sealing portion; and
    said semiconductor device further comprises, a heat release member contacting to said heat spreader and exposed in said opening portion.

16. A semiconductor device according to claim 15, wherein said heat release member has a plurality of penetration holes formed therein, said penetration holes passing from said heat spreader to the exposed surface of said heat release member.

17. A semiconductor device according to claim 16, wherein said penetration holes are formed in the periphery of said exposed surface of said heat release member.

18. A lead frame to be connected to a semiconductor chip in a package comprising:

a plurality of lead terminals having oppositely spaced, parallel surfaces, each of said lead terminals having an inner end for placement in closely spaced relation with respect to said semiconductor chip within said package and an outer end for extending from said package, said inner end of each of said lead terminals containing a recess provided on one of said surfaces which is opposite that adapted for bonding in said package and defining a thin plate portion having a thickness which is less than the thickness of the remainder of said lead terminal; and a connecting portion having opposing surfaces substantially coplanar with said oppositely spaced surfaces of said thinner plate portions of said inner leads interconnecting the thin plate portions of said inner leads.

19. A lead frame according to claim 18, wherein said thin plate portion has a shape formed by an etching process.

20. A lead frame according to claim 18, wherein said lead terminal comprises a plurality of metal plates laminated together, said thin plate portion having a shape formed by an etching process.

21. A lead frame according to claim 18, wherein said lead terminal comprises a plurality of metal plates laminated together, said plates being of unequal length, so as to form said thin plate portion.

22. A lead frame according to claim 18, wherein said lead terminal except said thin plate portion has a thickness proportionate to a desired thermal resistance thereof and to a strength of said outer lead.

* * * * *